(12) United States Patent
Caffrey et al.

(10) Patent No.: US 7,723,978 B2
(45) Date of Patent: May 25, 2010

(54) INSTRUMENTATION DEVICE AND INTERFACE COMBINING MULTIPLE ELEMENTS

(75) Inventors: Cynthia L. Caffrey, Blairstown, NJ (US); Richard A Carlson, Newton, NJ (US); Jongbin Ym, Hackettstown, NJ (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/952,175

(22) Filed: Dec. 7, 2007

(65) Prior Publication Data

US 2009/0146642 A1  Jun. 11, 2009

(51) Int. Cl.
    *G01R 1/00*  (2006.01)

(52) U.S. Cl. .................................................... 324/114
(58) Field of Classification Search ................... 324/114
    See application file for complete search history.

(56) References Cited

U.S. PATENT DOCUMENTS

2005/0125709 A1 *  6/2005  McKim et al. ................. 714/25

* cited by examiner

*Primary Examiner*—Ha Tran T Nguyen
*Assistant Examiner*—Shaun Campbell

(57) ABSTRACT

An instrumentation device having multiple elements includes at least one power supply module, a plurality of test and measurement instruments operatively coupled to the at least one power supply module and a user interface configured to select the at least one power supply module and to select at least one of the plurality of test and measurement instruments to provide power supply functionality and test and measurement functionality.

10 Claims, 4 Drawing Sheets

INSTRUMENTATION DEVICE AND INTERFACE COMBINING MULTIPLE ELEMENTS

BACKGROUND

Many instrumentation devices provide single or double device functionality. For example, a power supply used for testing electrical or electronic devices typically provides the power supply function and perhaps one additional instrumentation device function. For example, a power supply might also include a digital multi-meter (DMM).

Therefore, it would be desirable to have an instrumentation device that provides additional functionality and that presents this additional functionality to the user in a familiar form.

SUMMARY

In accordance with an embodiment, an instrumentation device having multiple elements includes at least one power supply module, a plurality of test and measurement instruments operatively coupled to the at least one power supply module and a user interface configured to select the at least one power supply module and to select at least one of the plurality of test and measurement instruments to provide power supply functionality and test and measurement functionality.

Other embodiments and methods of the invention will be discussed with reference to the figures and to the detailed description.

BRIEF DESCRIPTION OF THE FIGURES

The invention will be described by way of example, in the description of exemplary embodiments, with particular reference to the accompanying figures.

DETAILED DESCRIPTION

While described below for use in a power supply having the functionality of exemplary test and measurement instruments, the instrumentation device and interface combining multiple elements can be implemented to combine other test and measurement devices.

Figure 1:
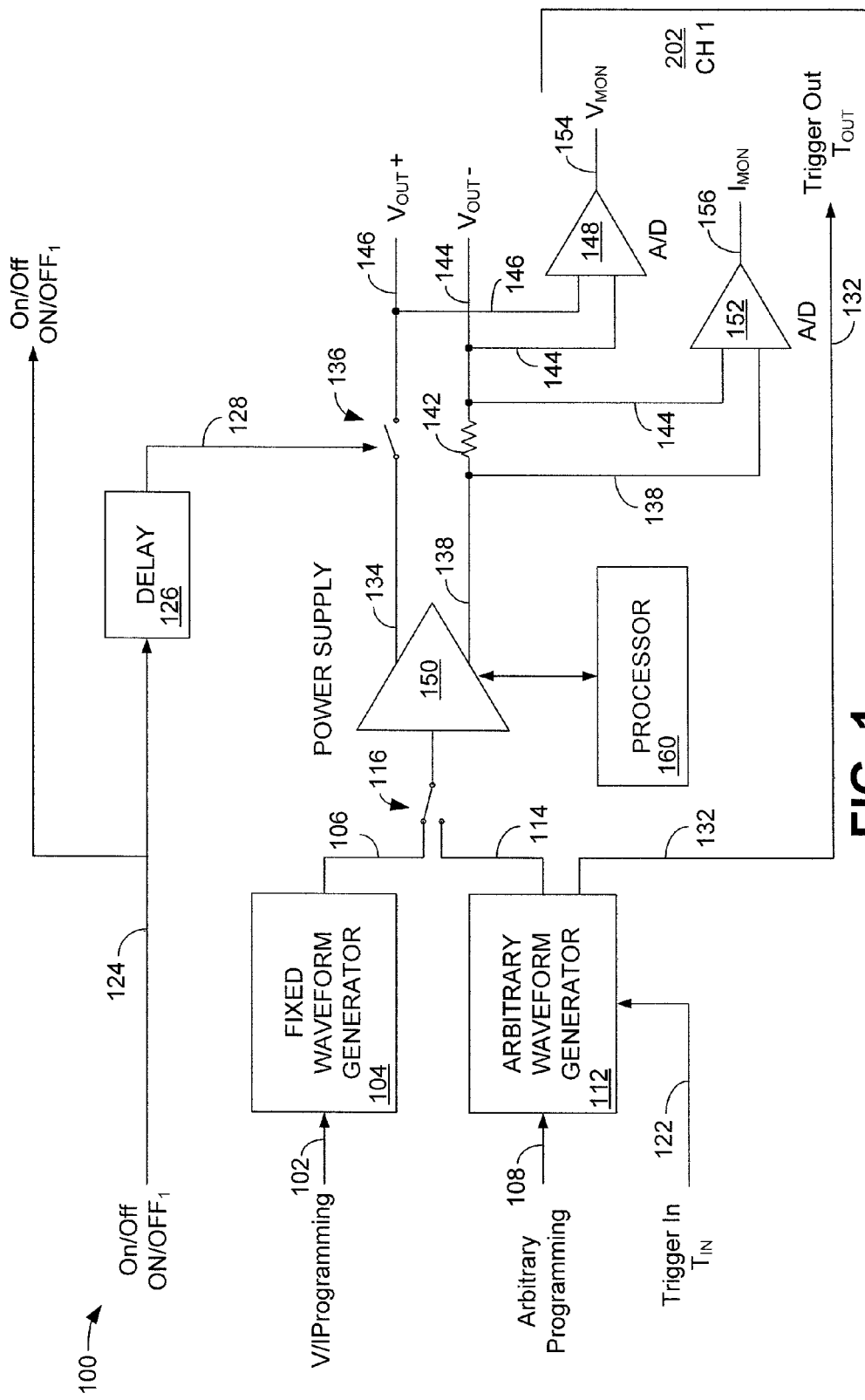
FIG. 1 is a schematic diagram illustrating a simplified power supply module.

FIG. 1 is a block diagram illustrating a simplified power supply module 100, which can be one of multiple instances of such power supply modules incorporated into an instrumentation device and interface combining multiple elements. In an embodiment, the power supply module 100 includes a power supply 150 coupled to a fixed waveform generator 104 and an arbitrary waveform generator 112. In an embodiment, a current and voltage programming signal is provided to the fixed waveform generator 104 via connection 102. Similarly, an arbitrary programming signal is supplied to the arbitrary waveform generator 112 via connection 108. A trigger input signal is provided via connection 122 to the arbitrary waveform generator 112. The output of the fixed waveform generator 104 is provided via connection 106 to a selection switch 116. An output of the arbitrary waveform generator 112 is provided via connection 114 to the selection switch 116. The selection switch 116 is coupled to the power supply 150. The selection switch 116 is typically controlled by a user to provide either the output of the fixed waveform generator 104 or the output of the arbitrary waveform generator 112 to the power supply 150.

A trigger output signal is provided from the arbitrary waveform generator 112 via connection 132. The trigger input signal and the trigger output signals are part of a communication packet that can be provided to the power supply module 100 to cause particular actions to occur. The output of the power supply 150 is provided via connections 134 and 138. Connection 134 includes a switch 136 controlled by a delay element 126 via connection 128. An on/off control signal is provided via connection 124 to the delay element 126. The output of the delay element 126 on connection 128 controls the switch 136. A resistance 142 is located in the power supply output 138. The positive and negative voltage output of the power supply 150 is taken from connections 146 and 144.

In an embodiment, an analog to digital (A/D) converter 148 is coupled across the output of the power supply 150 on connections 144 and 146. The A/D converter 148 provides a digital output on connection 154. The signal on connection 154 is a voltage signal, $V_{MON}$, that corresponds to the output voltage of the power supply 150. In an embodiment, an A/D converter 152 is connected across the resistance 142 on connections 138 and 144. The A/D converter 152 provides a digital output on connection 156. The signal on connection 156 is a voltage signal, $I_{MON}$, that corresponds to the output current of the power supply 150. Although referred to as "$I_{MON}$", the signal on connection 156 is a voltage signal. The signals on connections 154, 156 and 132 form what is referred to as a power supply module output "channel" 202 corresponding to the power supply module 100. In an embodiment, a number of power supply modules are included in a multiple element instrumentation device.

The power supply module 100 also includes a processor 160 that is coupled to the power supply 150. The processor 160 controls various operating parameters of the power supply 150.

Figure 2:
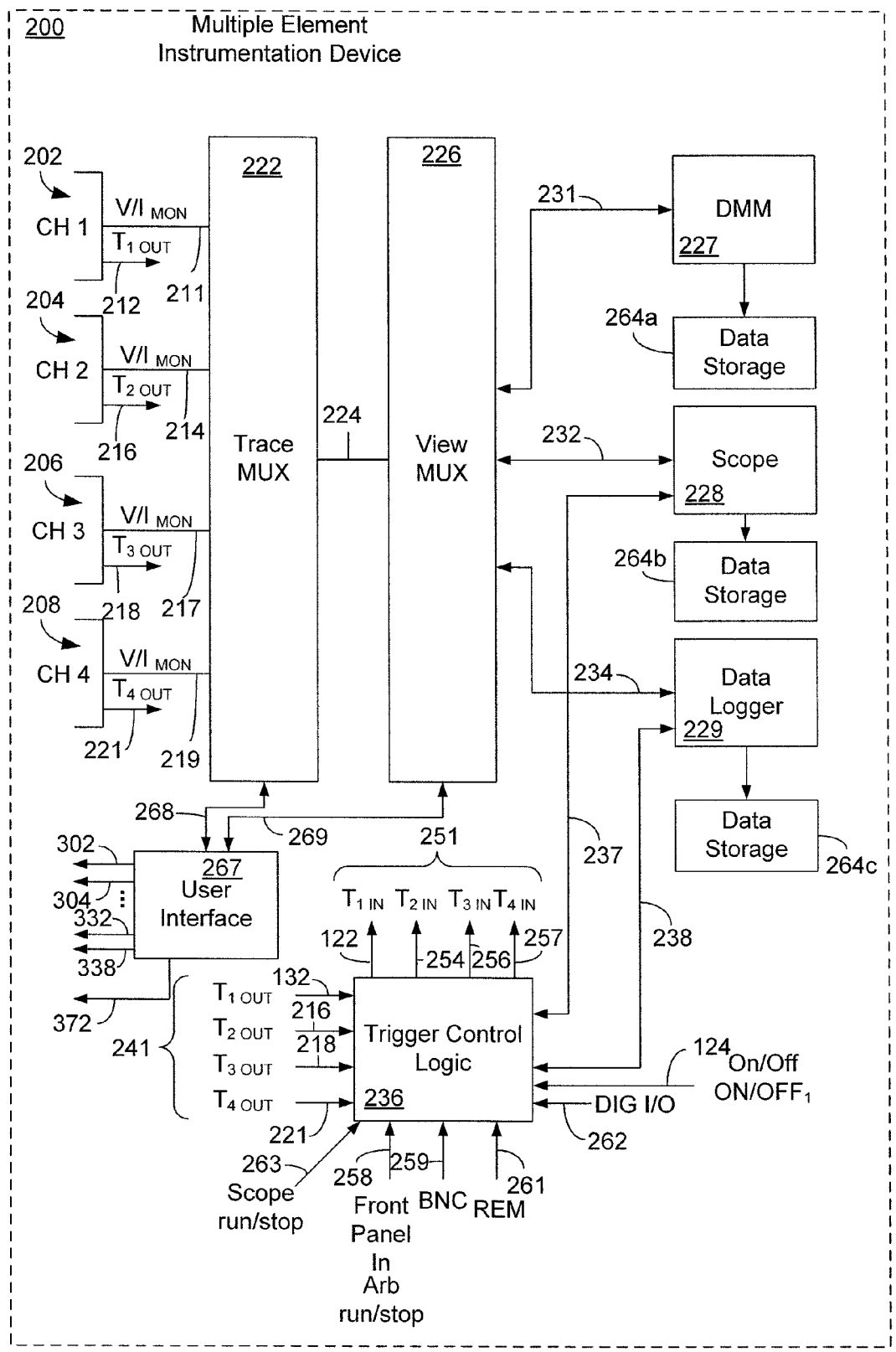
FIG. 2 is a schematic diagram illustrating an embodiment of a multiple element instrumentation device including four power supply modules of FIG. 1.

FIG. 2 is a schematic diagram illustrating an embodiment of a multiple element instrumentation device 200 including inputs from four power supply modules of FIG. 1 and having additional test and measurement instruments. In this example, the additional test and measurement instruments include, but are not limited to, a digital multi-meter (DMM) 227, an oscilloscope 228, which can be a digitizing oscilloscope, and a data logger 229. Each of the DMM 227, oscilloscope 228 and data logger 229 are coupled to a data storage element 264a, 264b and 264c, respectively. The data storage elements 264a, 264b and 264c may be components of a single data storage element, or may be discrete storage elements.

In this embodiment, the instrumentation device 200 is associated with and receives the output of four (4) instances of the power supply module 100 of FIG. 1. However, the instrumentation device 200 may be associated with more or fewer power supply modules 100. Each of the power supply modules provides an input to the instrumentation device 200 via a communication channel. The four communication channels are indicated at 202, 204, 206 and 208. As an example, the communication channel 202 corresponds to the power supply module 100 of FIG. 1. The communication channel includes a connection 211, over which the $V_{MON}$ and the $I_{MON}$ signals are provided. In addition, the communication channel 202 includes a connection 212 over which the channel 1 trigger output signal $T_{1\ OUT}$ is provided (132 in FIG. 1). The second, third and fourth communication channels 204, 206 and 208 include corresponding connections 214, 217 and 219, respectively, for the $V_{MON}$ and the $I_{MON}$ signals from the three other instances of the power supply modules (not shown). Similarly, the second, third and fourth communication channels 204, 206 and 208 include corresponding connections 216, 218 and 221, respectively, for the $T_{2\ OUT}$, $T_{3\ OUT}$ and the $T_{4\ OUT}$ trigger signals from the three other instances of the power supply modules (not shown).

The signals on each of the communication channels 202, 204, 206 and 208 are provided to what is referred to as a "trace" multiplexer 222. The trace multiplexer 222 is coupled over connection 224 to what is referred to as a "view" multiplexer 226. The connection 224 is a parallel connection having a plurality of channels.

A user interface element 267 is coupled to the trace multiplexer 222 via connection 268 and to the view multiplexer 226 via connection 269. The user interface element 267 provides correlation and coordination of the multiple test and measurement instruments and provides a unified interface to a user of the instrumentation device 200.

The DMM 227 is coupled to the view multiplexer 226 via connection 231. The oscilloscope 228 is coupled to the view multiplexer 226 via connection 232. The data logger 229 is coupled to the view multiplexer 226 via connection 234.

The trace multiplexer 222 selects one or more of the channels 202, 204, 206 and 208 based on input provided from the user interface 267. The view multiplexer 226 selects one of the DMM 227, oscilloscope 228 and the data logger 229 based on input provided from the user interface 267.

The instrumentation device 200 also includes a trigger control logic 236. The trigger control logic 236 is connected to the oscilloscope 228 over connection 237 and is connected to the data logger 229 over connection 238. Each of the trigger output signals 241, $T_{1\ OUT}$, $T_{2\ OUT}$, $T_{3\ OUT}$ and $T_{4\ OUT}$ are provided to the trigger control logic 236. The trigger control logic 236 provides trigger input signals 251, $T_{1\ IN}$, $T_{2\ IN}$, $T_{3\ IN}$ and $T_{4\ IN}$ via connections 122, 254, 256 and 257, respectively. For example, the trigger input signal $T_{1\ IN}$ 122 corresponds to the trigger input signal $T_{IN}$ provided to the power supply module 100 on connection 122 of FIG. 1. Similarly, the trigger output signal $T_{1\ OUT}$ 132 corresponds to the trigger output signal $T_{OUT}$ provided by the power supply module 100 on connection 132 of FIG. 1. The trigger output signals 241 and the trigger input signals 251 are described in commonly-assigned, co-pending U.S. patent application Ser. No. 10/857,134, entitled "Improved Communications System for Implementation of Synchronous, Multi-channel, Galvanically Isolated Instrumentation Devices", filed on May 28, 2004, and incorporated herein by reference.

The trigger control logic 236 can be provided with a user defined digital input/output signal via connection 262, a scope run/stop trigger input via connection 263, a front panel ARB run/stop trigger input via connection 258, a remote controller input via connection 261 and a BNC connection input via connection 259.

The trigger control logic 236 presents a user with intelligently chosen connection options and eliminates some of the possible connections that are not useful. For example, if the user selects the front panel ARB run/stop trigger input 258, the trigger control logic 236 will automatically route the signal on connection 258 to the connections $T_{1\ IN}$ on connection 122, $T_{2\ IN}$ on connection 254, $T_{3\ IN}$ on connection 256 and $T_{4\ IN}$ on connection 257 and will disconnect the connections $T_{1\ OUT}$ on connection 132, $T_{2\ OUT}$ on connection 216, $T_{3\ OUT}$ on connection 218 and $T_{4\ OUT}$ on connection 221. The trigger control logic 236 can also disallow other inputs such as the remote controller input on connection 261 and the digital input/output signal on connection 262, depending on other settings the user has chosen. The trigger control logic 236 can eliminate potential undesirable feedback loops by disallowing connections that would cause such undesirable feedback. For example the trigger control logic 236 will not allow the signal $T_{1\ OUT}$ on connection 132 to be coupled to the signal $T_{1\ IN}$ on connection 122.

Another aspect of the trigger control logic 236 is that in addition to controlling the trigger signal routing, the trigger control logic 236 provides additional trigger signals that are not typically available when separate test and measurement instruments are implemented. For example, the trigger control logic 236 receives the on/off signal described above on connection 124. Other examples include, but are not limited to, the scope run/stop trigger input signal on connection 263 and the front panel ARB run/stop trigger input signal on connection 258 via the front panel input. With prior instruments, the scope run/stop trigger input signal and the front panel ARB run/stop trigger input signal are not accessible to users and cannot be used to trigger an external device. In this embodiment, the trigger control logic 236 is used to direct the scope run/stop trigger input signal and the front panel ARB run/stop trigger input signal to control multiple events within the module 100. For example, a user can choose to have the scope run/stop trigger input signal simultaneously trigger the oscilloscope 228 and trigger the arbitrary waveform generator 112 on channels 1 and 3. Other functions can be triggered including any combination of the power supply modules (100 in FIG. 1) and the DMM 227, oscilloscope 228 and the data logger 229.

Figure 3:
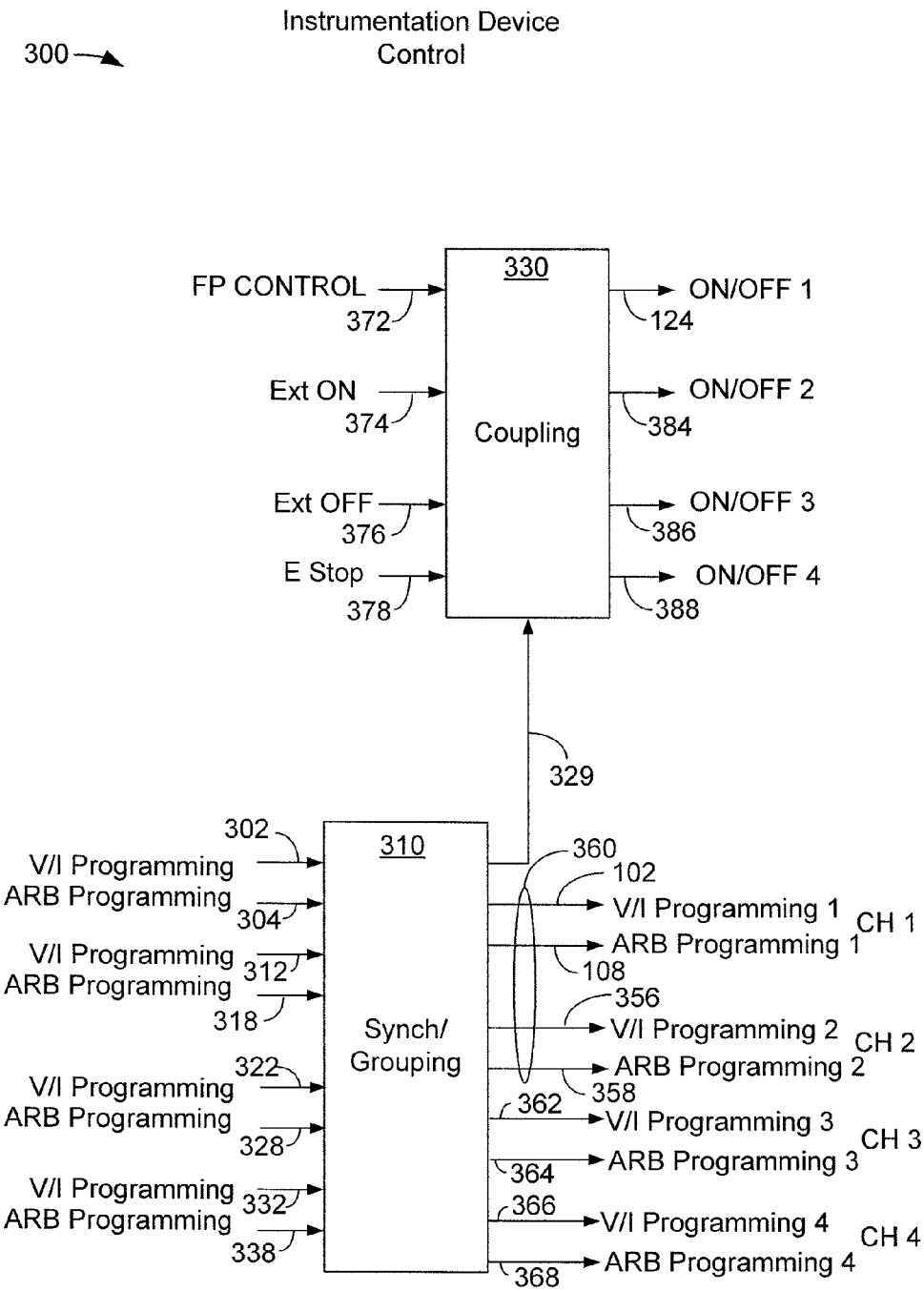
FIG. 3 is a block diagram illustrating additional instrumentation device control functionality of the multiple element instrumentation device of FIG. 2.

FIG. 3 is a block diagram illustrating additional instrumentation device control functionality of the multiple element instrumentation device 200 of FIG. 2. The instrumentation device control element 300 includes a synchronization/grouping element 310 and a coupling element 330. The synchronization/grouping element 310 can be implemented as firmware or software that can be executed by the processor 160 of FIG. 1.

The input to the synchronization/grouping element 310 is provided by the user interface 267 (FIG. 2). In an embodiment, the user interface 267 provides the V/I programming and the arbitrary waveform generator programming for each channel. For example, the programmed voltage and current signal for the first channel is provided over connection 302 and the arbitrary waveform generator programming is provided over connection 304. The programmed voltage and current signal for the second channel is provided over connection 312 and the arbitrary waveform generator programming is provided over connection 318. The programmed voltage and current signal for the third channel is provided over connection 322 and the arbitrary waveform generator programming is provided over connection 328. The programmed voltage and current signal for the fourth channel is provided over connection 332 and the arbitrary waveform generator programming is provided over connection 338. In this embodiment, the logical on/off signal for each instance of the power supply module is embedded in the programmed voltage and current signals on connections 302, 312, 322 and 332.

A programmed voltage and current signal for each of the power supply modules, such as the power supply module 100 of FIG. 1, is provided by the synchronization/grouping element 310.

For example, the programmed voltage and current signal for the power supply module 100 corresponding to logical channel one 202 is provided over connection 102 and the arbitrary waveform generator programming is provided over connection 108. The programmed voltage and current signal for a second power supply module (not shown), logical channel two 204, is provided over connection 356 and the arbitrary waveform generator programming is provided over connection 358. The programmed voltage and current signal for a third power supply module (not shown), logical channel three 206 is provided over connection 362 and the arbitrary waveform generator programming is provided over connection 364. The programmed voltage and current signal for a fourth power supply module (not shown), logical channel four 208 is provided over connection 366 and the arbitrary waveform generator programming is provided over connection 368. The synchronization/grouping element 310 performs the logical grouping and creates the programming signals on connections 102, 108, 356, 358, 362, 364, 366 and 368, and creates logically grouped power supply channels.

The programmed voltage and current signals for any power supply module, i.e., logical channels 202, 204, 206 and 208 in this four-channel example, may be combined with the programmed voltage and current signals from any other logical channel to provide a grouping that combines the programmed voltage and current signals for two or more channels. In this manner, a channel is created that comprises the outputs of two or more power supply modules. For example, the programmed voltage and current signals on connection 102 and the arbitrary waveform generator programming on connection 108 may be combined with the programmed voltage and current signals on connection 356 and the arbitrary waveform generator programming on connection 358 to form a combined channel 360. In this example, the combined channel 360 provides programming to two power supply modules to provide a logically combined output from two power supply modules.

In addition, the synchronization/grouping element 310 modifies the behavior of the trigger control logic 236 (FIG. 2) so that a grouped channel, such as channel 360, acts as a single channel for all output transitions, measurements and arbitrary waveform functions.

The coupling element 330 is connected to the synchronization/grouping element 310 over connection 329. The signal on connection 329 transmits the grouping information from the synchronization/grouping element 310 to the coupling element 330. In this manner, the grouped channels, such as the channels 102, 108, 356 and 358 that form the grouped channel 360, are turned on and off at the same time so they act as one channel.

The coupling element 330 receives input signals over connections 372, 374, 376 and 378. The signal on connection 378 is provided from a switch on the front panel (not shown) labeled "Emergency Stop" and is an OFF signal to all outputs regardless of coupling or grouping. The signal on connection 376 is a digital control signal from an external device (not shown) that will send the "OFF" signal to channels that are configured to receive it. The signal on connection 374 is a digital control signal from an external device (not shown) that will send the "ON" signal to channels that are configured to receive it. The signal on connection 372 is a control signal provided by the user interface 267. The signal on connection 372 controls the configuration of the coupling element 330 and provides ON/OFF input from the front panel keypad (not shown).

The coupling element 330 provides on/off control signals for each of the channels over connections 124, 384, 386 and 388. For example, the on/off control signal on connection 124 is the control signal on/off, in FIG. 1. The on/off control signals on connections 384, 386 and 388 are provided to the second, third and fourth power supply modules (not shown).

In accordance with an embodiment of the instrumentation device and interface combining multiple elements, the functionality of a power supply 150, an arbitrary waveform generator 112, a DMM 227, an oscilloscope 228 and a data logger 229 are integrated into a multiple element instrumentation device 200. Such integration allows the multiple element instrumentation device 200 to provide accurate direct current (DC) voltage and current power measurements. The user interface presents the multiple device functionality in a familiar and easy to use user interface and simplifies the internal connections and settings so that a simple user interface is presented to a user. The underlying functionality of the power supply 150, arbitrary waveform generator 112, DMM 227, oscilloscope 228 and a data logger 229 are presented to a user as a set of familiar instruments with integrated controls. The power supply module 100 includes a programmable DC voltage and current source (current/voltage programming); a programmable stimulus system that can generate changes in voltage and current with programmable time increments using the trigger input and trigger output signals, a digitizing measurement system in the form of oscilloscope 228 for measuring voltage and current waveforms and digital input and output ports that are level and edge sensitive.

In accordance with an embodiment, multiple instruments are presented to a user in a familiar fashion in both the display and control aspects of the user interface. The oscilloscope display appears similar to the display found on a standalone oscilloscope device and is principally controlled by a set of physical controls found on a typical oscilloscope. Examples of the controls are the controls for V/Div, Time/Div, Vertical Offset, Horizontal offset controls, run/stop key and trigger level. In addition, each power supply module includes voltage and current controls and on/off buttons that are typical of the controls found on power supply instruments.

The multiple element instrumentation device 200 is generally divided into a stimulus section, which includes the arbitrary waveform generator 112 and the power supply 150, and a measurement or view section, which includes the DMM 227, oscilloscope 228 and data logger 229. The user interface 267 allows a user to select the stimulus and measurement section.

The stimulus view allows a user to select the power supply stimulus settings, including voltage setting, voltage programming range, voltage slew, maximum voltage slew, current setting, current programming range and polarity. In addition, the arbitrary waveform generator 112 can be independently selected.

The measurement views can be selected using the user interface 267 to select the DMM 227, oscilloscope 228 and the data logger 229.

Figure 4:
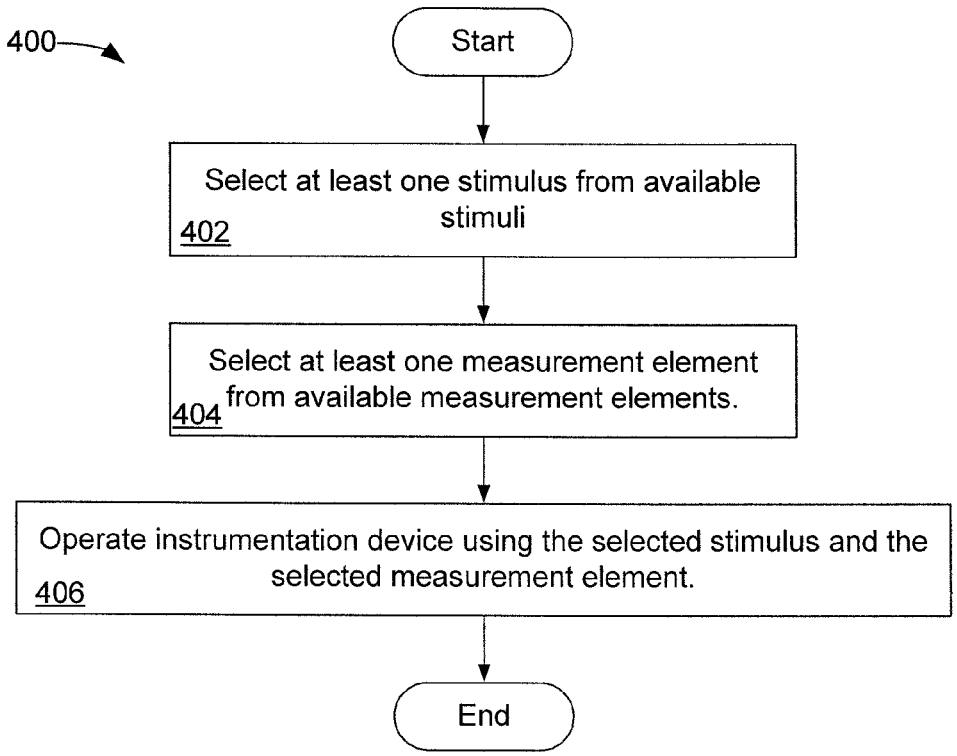
FIG. 4 is a flowchart showing the operation of an embodiment of a multiple element instrumentation device.

FIG. 4 is a flowchart 400 showing the operation of an embodiment of a multiple element instrumentation device. The blocks in the flowcharts of FIGS. 4 and 5 can be performed in or out of the order shown. In block 402, a user selects a stimulus associated with the instrumentation device. The stimulus can be selected from a plurality of available stimuli including, but not limited to, a power supply, one of a plurality of power supplies and an arbitrary waveform generator. In block 404, a user selects a measurement element associated with the instrumentation device. The measurement element can be selected from a plurality of available measurement elements including, but not limited to, a digital multi-meter 227, an oscilloscope 228 and a data logger 229. In block 406, the multiple element instrumentation device is operated using the selected stimulus and the selected measurement element.

Figure 5:
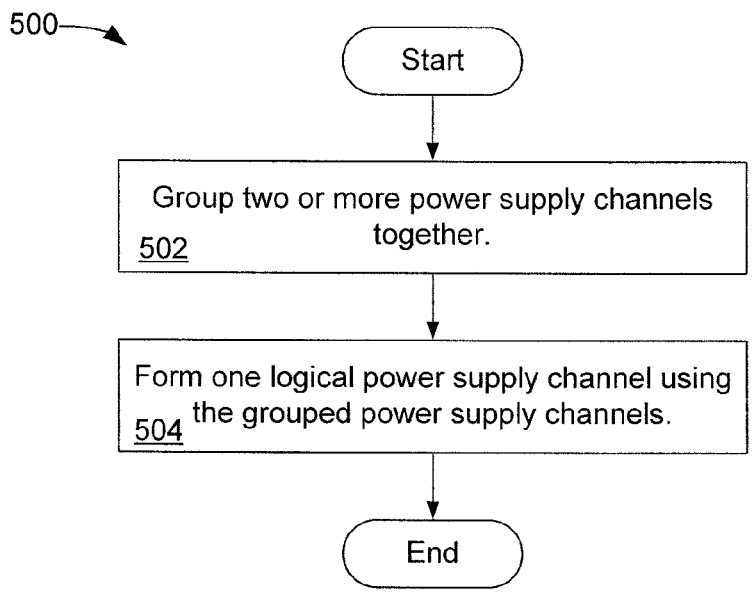
FIG. 5 is a flowchart showing the operation of an alternative embodiment of a multiple element instrumentation device.

FIG. 5 is a flowchart 500 showing the operation of an alternative embodiment of a multiple element instrumentation device. In block 502, two or more power supply channels, such as power supply channels 202, 204, 206 and 208, are grouped together by the synchronization/grouping element 310. In block 504, one logical power supply channel, such as the logical power supply channel 360, is formed using the grouped power supply channels.

The foregoing detailed description has been given for understanding exemplary implementations of the invention and no unnecessary limitations should be understood therefrom as modifications will be obvious to those skilled in the art without departing from the scope of the appended claims and their equivalents.

What is claimed is:

1. An instrumentation device having multiple elements, comprising:
    at least two power supply modules;
    a plurality of test and measurement instruments, each of the test and measurement instruments operatively coupled to at least one of the power supply modules;
    a user interface configured to select at least one of the power supply modules and to select at least one of the plurality of test and measurement instruments to provide power supply functionality and test and measurement functionality; and
    a synchronous/grouping element configured to combine inputs to at least two of the power supply modules to provide a logically combined power supply output.

2. The instrumentation device of claim 1, wherein the plurality of test and measurement instruments are selected from an arbitrary waveform generator, a digital multi-meter (DMM), an oscilloscope and a data logger.

3. The instrumentation device of claim 1, further comprising a user interface configured to select a stimulus and a measurement, wherein the stimulus is chosen from a power supply and an arbitrary waveform generator and the measurement is chosen from a digital multi-meter (DMM) an oscilloscope and a data logger.

4. The instrumentation device of claim 1, further comprising a trigger control logic configured to provide intelligent routing of trigger signals.

5. The instrumentation device of claim 1, further comprising a control element configured to provide on/off control of the power supply module through a delay element.

6. A power supply that combines the functionality of a plurality of test and measurement devices, comprising:
    at least two power supply modules;
    a plurality of test and measurement instruments, each of the test and measurement instruments operatively coupled to at least one of the power supply modules;
    a user interface configured to select at least one of the power supply modules and to select at least one of the plurality of test and measurement instruments to provide power supply functionality and test and measurement functionality; and
    a synchronous/grouping element configured to combine inputs to at least two of the power supply modules to provide a logically combined power supply output.

7. The power supply of claim 6, wherein the plurality of test and measurement instruments are selected from an arbitrary waveform generator, a digital multi-meter (DMM), an oscilloscope and a data logger.

8. The power supply of claim 6, further comprising a user interface configured to select a stimulus and a measurement, wherein the stimulus is chosen from a power supply and an arbitrary waveform generator and the measurement is chosen from a digital multi-meter (DMM) an oscilloscope and a data logger.

9. The power supply of claim 6, further comprising a trigger control logic configured to provide intelligent routing of trigger signals.

10. The power supply of claim 6, further comprising a control element configured to provide on/off control of the power supply module through a delay element.

* * * * *